(12) United States Patent
Yoshimura

(10) Patent No.: US 6,490,198 B2
(45) Date of Patent: Dec. 3, 2002

(54) TEST METHODS FOR SEMICONDUCTOR NON-VOLATILE MEMORIES

(75) Inventor: Satoshi Yoshimura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/922,791

(22) Filed: Aug. 7, 2001

(65) Prior Publication Data

US 2002/0018365 A1 Feb. 14, 2002

(30) Foreign Application Priority Data

Aug. 7, 2000 (JP) ......................... 2000-239055

(51) Int. Cl.⁷ .............................. G11C 16/06
(52) U.S. Cl. ..................... 365/185.09; 365/185.02; 365/185.19
(58) Field of Search ........................ 365/185.02, 185.09, 365/185.19, 201

(56) References Cited

U.S. PATENT DOCUMENTS 5,155,701 A * 10/1992 Komori ...................... 365/182
5,712,816 A * 1/1998 Cappelletti ............. 365/185.05
5,793,675 A * 8/1998 Cappelletti ............. 365/185.09

FOREIGN PATENT DOCUMENTS

JP 9-91980 4/1997

* cited by examiner

Primary Examiner—A. Zarabian
(74) Attorney, Agent, or Firm—Morrison & Foerster, LLP

(57) ABSTRACT

In the test of semiconductor non-volatile memories having floating gates, a plurality of memory cells that are connected to an identical word line are programmed simultaneously. A voltage to complete programming these memory cells is the final voltage. After erasing all of the memory cells, a disturbance stress pulse train having voltages changing in increments are applied up to or before the final voltage. Almost simultaneously, the semiconductor non-volatile memory is tested by measuring the lowest threshold voltage among the memory cells on each word line.

7 Claims, 11 Drawing Sheets

TEST METHODS FOR SEMICONDUCTOR NON-VOLATILE MEMORIES

BACKGROUND OF THE INVENTION

1. Field of the Invention

The present invention relates to a test method of measuring a disturbance value and a disturbance margin that are caused when a program disturbance stress is applied to a semiconductor non-volatile memory comprising a plurality of memory cells each having a gate, a floating gate, a drain, and a source.

2. Description of the Prior Art

A flash memory is one of such semiconductor non-volatile memories having a floating gate. A structural example of a semiconductor non-volatile memory is shown in FIG. 15. FIG. 15 shows a simplified cross-sectional view of the semiconductor non-volatile memory. This memory cell has a gate 1 having a control terminal 11, a floating gate 2, a drain 3 having a drain terminal 13, and a source 4 having a source terminal 14. A tunnel oxide layer 6 is formed between a substrate 5 and the floating gate 2.

A memory cell 21 shown in FIG. 15 takes either of two statuses, a programmed status ("1") or an erased status ("0") depending on an amount of charge stored in the floating gate 2. For example, when a channel formed between the drain 3 and the source 4 becomes non-conductive, the status of the memory cell is defined as "0", and as "1" when the channel becomes conductive. In this way, the memory cell can hold and provide two-level data depending on the amount of charge stored in the floating gate 2.

By applying, for example, a positive voltage to the control terminal 11, and a negative voltage to the substrate 5, the drain terminal 13, and the source terminal 14, electrons are injected from the channel formed between the drain 3 and the source 4 into the floating gate 2 by a phenomenon called Fowler-Nordheim tunnel effect (hereinafter referred to as FN tunnel effect). Thus, the data of the memory cell is set to "0". Under this condition, the negative charge stored in the floating gate 2 behaves like a barrier and prevents a current from flowing between the drain 3 and the source 4 even if a positive voltage is applied to the control terminal 11.

On the other hand, by applying, for example, a negative voltage to the control terminal 11 and a ground level to the substrate 5, and also by applying a positive voltage to the drain terminal 13, the negative charge that has been stored in the floating gate 2 is pulled out to the drain. Thus, the data of the memory cell is set to "1". Under this condition, applying a positive voltage to the control terminal 11 allows a current to flow between the drain 3 and the source 4.

A memory cell array is composed of a plurality of such memory cells as described before. FIG. 16 shows an example of memory cell array circuit. A memory cell array 31 has six memory cells, 21a to 21f (hereinafter, these memory cells in FIG. 16 are collectively referred to as memory cell 21). The control terminal 11 of each memory cell is connected to a word line 32. Furthermore, the drain terminal 13 of one particular memory cell and the source terminal 14 of an adjacent memory cell are connected to a bit line 33. The memory cell array 31 is provided with seven bit lines, 33a to 33g (hereinafter, these bit lines in FIG. 16 are collectively referred to as bit line 33).

Before writing data to the memory cell array 31, memory cells should be erased by an injection of an excessive amount of negative charge into the floating gate 2 thereof. Then, for example, as shown in FIG. 16, a negative voltage −Vg is applied to the word line 32 to which each control terminal 11 of the memory cell 21 is connected. For example, if data "0" is written to the memory cell 21d, the bit line 33e connected to a drain terminal 13f thereof should be left floating (F), (hereinafter, all the drain terminals that are left floating are referred to as 13f). When, for example, writing data "1" to the memory cell 21b, the positive voltage +Vd is applied to the bit line 33c to which the drain terminal 13 thereof is connected.

When writing data "0", the negative charge does not move from a floating gate 2f (hereinafter, the floating gate storing the negative charge is referred to as 2f) to the drain because the drain terminal 13f is left floating, and therefore a sufficiently high electric field to initiate the FN tunnel effect will not be generated in the tunnel oxide layer 6. On the other hand, when writing data "1", the negative charge moves from the floating gate 2 to the drain because the positive voltage +Vd is applied to the drain terminal 13 generating a sufficiently high electric field to initiate the FN tunnel effect in the tunnel oxide layer 6. In this way, data "1" is written to the memory cell.

Individual memory cells that altogether constitute a memory cell array are not uniform in properties because of manufacturing variations or the like. When writing to memory cells (programming), as described before, the negative voltage −Vg is applied as a stress voltage through a word line to the control terminal of the memory cell that is supposed to be written to "0". Considering these factors, if a plurality of memory cells sharing an identical word line have a fairly large amount of variations in properties, some memory cells may switch from "0" to "1" when the negative charge stored in the floating gate thereof moves to the drain initiated by the FN tunnel effect despite that the bit line thereof is left floating. In this way, the stress voltage may cause a threshold voltage to decline.

It is, therefore, extremely important to measure the amount of disturbance received by each memory cell that altogether constitutes a memory cell array. In constructing a test program algorithm, it is also important to measure a disturbance margin which is an indication of margin between the algorithm of the test program and the actual memory cells to be tested. These values can be also utilized as criteria during an outgoing inspection of products.

Measuring the program disturbance value and the disturbance margin that indicate an amount of disturbance when the memory cells are programmed, is an intrinsically necessary test regardless of types of flash memories. Specifically, if the polarity of writing voltage or the like is optimally adjusted, this test method can be employed for testing such flash memories as NOR, NAND, DINOR, virtual-ground NOR types, and the like regardless of types. Mentioned hereunder are examples of the conventional test methods for evaluating the amount of program disturbance on memory cells.

Test Method 1

An extremely common evaluation method includes steps to apply to erased memory cells, a program disturbance stress that is equivalent to the one prescribed by specifications, then to read each memory cell, and to evaluate the result to see if the memory cells still maintain the erased status.

Test Method 2

Another program disturbance stress test includes steps to apply to the erased memory cells, a program disturbance stress that is equivalent to the one prescribed by specifications or the like, then to evaluate whether or not the resultant threshold levels have exceeded the specified level or the like.

Test Method 3

In order to conduct a more accurate test for the program disturbance margin, another test includes a first procedure to measure the time or the number of program pulse steps required for completing programming all the memory cells that undergo the programming operation simultaneously. In a second procedure, among identical memory cells, the time or the number of pulse steps required for the first memory cell to shift from the erased level to the programmed level after being stressed under the program disturbance will be measured. The results in terms of the time or the number of steps obtained through the above two procedures will be compared for evaluation.

However, the above-mentioned test methods have the following shortcomings. a Test method 1 is only effective for judging if some memory cells have caused a disturbance fault (a memory cell switching from the erased level to the programmed level unnecessarily under the stress) under the program disturbance stress. The shortcoming of this method, however, is that no information on the program disturbance margin can be obtained.

Test method 2 is effective in knowing whether or not the memory cells have the program disturbance margin that is prescribed by specifications or the like. The shortcoming of this method, however, is that the amount of margin itself can not be obtained.

Test method 3 is effective for making a quantitative evaluation on the program disturbance margin that has been prescribed by specifications or the like. However, it generally takes much longer time to cause a disturbance fault than to complete programming memory cells. As a result, the shortcoming of this test method is that it takes very long time to complete the test because the program disturbance stress should be kept applying until the actual disturbance fault is caused.

The Japanese Patent Application Laid-Open No. H9-91980 discloses methods for programming semiconductor non-volatile memories in two- or multiple-level by employing a linier curve relation between the voltage applied to the control terminal and the threshold value thereof. This document, however, does not disclose a test method for semiconductor non-volatile memories. Particularly, a test method for evaluating whether non-volatile memories are good or defective when the disturbance stress is applied to control terminals thereof is not disclosed.

SUMMARY OF THE INVENTION

An object of the present invention is to provide test methods for semiconductor non-volatile memories, thereby enabling disturbance values and disturbance margins to be tested and evaluated accurately in a shorter period of time.

To achieve the above object, according to one aspect of the present invention, a method of testing a semiconductor non-volatile memory comprising a plurality of memory cells each of which has a gate, a floating gate, a drain, and a source, includes:

a first step of applying, after erasing the memory cells, a program disturbance stress pulse train whose voltage changes in increments, to a word line to which the memory cells are connected, up to the voltage reaches a final voltage required to complete programming all the memory cells that share an identical word line and are subjected to an identical program disturbance stress simultaneously;

a second step of repeating the first step by changing word lines until a final word completed; and a third step of measuring a lowest threshold value among the memory cells sharing an identical word line by changing word lines until the final word line is completed.

In the case of a semiconductor non-volatile memory, a disturbance value and a disturbance margin on each word line can be measured and evaluated simply by obtaining the lowest threshold voltage on each word line because the most disturbed memory cell among the memory cells sharing an identical word line has the lowest threshold value.

According to another aspect of the present invention, said program disturbance stress pulse train has incremental pulses wherein a ratio of a voltage increase to a pulse width is always constant.

Therefore, a difference between the lowest threshold value to maintain the erased level and the lowest threshold value obtained on each word line from the memory cells sharing the identical word line can translate directly into the program disturbance margin for the voltage applied to each word line. It also becomes possible to calculate the number of necessary test steps.

According to another aspect of the present invention, said semiconductor nonvolatile volatile memory has reference memory cells. When applying said program disturbance pulse train, a program pulse train is also applied to a drain terminal of the reference memory cell, wherein the program disturbance stress train is kept being applied up to the step in which the reference memory cell has been programmed or up to a specified step beyond the step in which the reference memory cell has been programmed.

By employing the reference memory cell, it becomes possible to conduct a concurrent test including the program test and the program disturbance test covering each word line voltage by which the reference memory cell completes programming.

In this case, a dedicated reference memory cell region may be provided outside the region in which all of the memory cells receive an identical program disturbance stress simultaneously. It is also possible to provide any given memory cell out of memory cells that receive an identical program disturbance stress simultaneously, as a reference memory cell. In this case, it becomes possible to conduct tests for the program disturbance value and the program disturbance margin without increasing a memory chip size.

According to another aspect of the present invention, said final voltage mentioned in the first aspect of the present invention, may be any given voltage within a step required to complete programming a plurality of memory cells that are connected to an identical word line and receive an identical program disturbance stress simultaneously.

It is, therefore, possible to shorten the time required for completing the test because the number of steps for applying the disturbance stress pulse is reduced for each word line than otherwise necessary.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, embodiments of the present invention will be described with reference to the accompanying drawings.

First Embodiment

Figure 1:
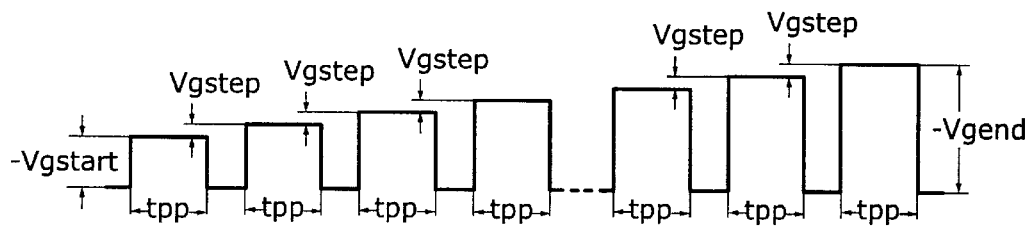
FIG. 1 is a schematic diagram showing a program disturbance pulse train.

In this embodiment, an algorithm of a program disturbance test that constitutes a semiconductor non-volatile memory test will be described. The principle part of the test algorithm is broadly consisting of two parts, to be more specific, a flow to apply a program disturbance stress to each memory cell of a memory array, and another flow to read a threshold voltage from the most disturbed memory cell. FIG. 1 is a schematic diagram showing a program disturbance pulse train.

In this embodiment, after erasing memory cells, the following steps are repeated by changing word lines until a final word line is completed. The steps includes applying to each word line of a semiconductor non-volatile memory, a program disturbance pulse train, as shown in FIG. 1, having a constant pulse width at tpp and a constant pulse interval, and having stepped pulses in that the voltage increases, in terms of absolute value, by Vgstep between pulses, until the voltage reaches −Vgend, a highest voltage in terms of absolute figure and a final voltage required to complete programming all memory cells sharing an identical word line.

After applying the program disturbance stress pulse train to all word lines, a threshold voltage of the most disturbed memory cell on each word line will be measured to obtain a lowest threshold voltage of each word line.

Figure 16:
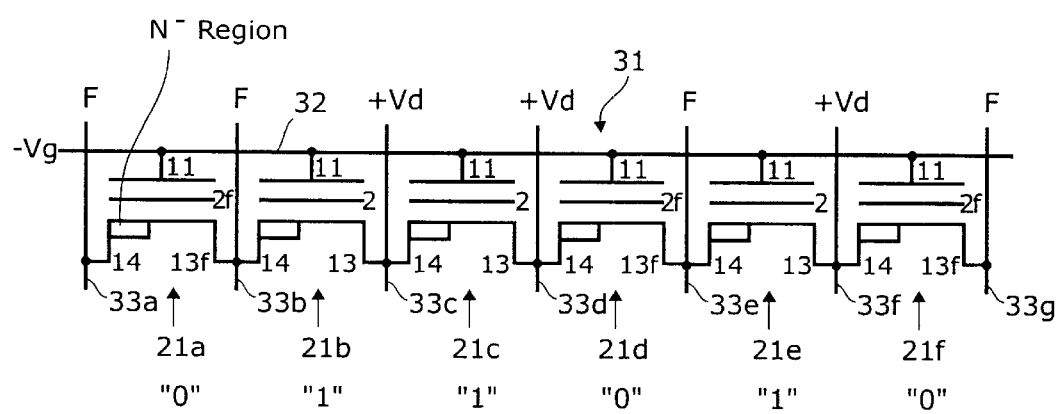
FIG. 16 is a circuit diagram showing an example of memory cell array.

For example, in the case of a memory cell array as shown in FIG. 16, a disturbance value of each word line can be tested and evaluated simply by obtaining the lowest threshold voltage on each word line because the most disturbed memory cell among the memory cells sharing the identical word line has the lowest threshold voltage.

Figure 15:
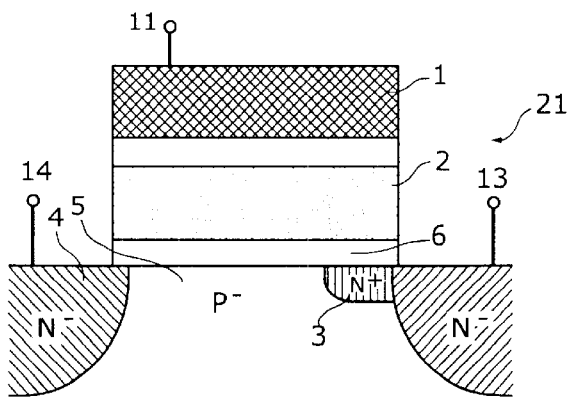
FIG. 15 is a simplified cross sectional diagram of a semiconductor non-volatile memory.

Next, the program disturbance margin will be obtained as a difference between the lowest threshold voltage of each word line as obtained above and a lowest threshold limit to maintain the erased level. As described in the aforementioned Japanese Patent Application Laid-Open No. H9-91980, when programming such a memory cell 21 shown in FIG. 15, by utilizing the FN tunnel effect, the memory cell threshold value decreases by an amount equivalent to an amount of voltage increase when such stepped pulses as the program disturbance stress pulse train shown in FIG. 1 are applied to a control terminal 11 while simultaneously applying a prescribed constant voltage to a drain terminal 13 thereof.

The above-mentioned phenomenon is applied to the program disturbance test of the present invention. That is, a decrease in the threshold voltage divided by an increase in the voltage between pulses equals to 1. Therefore, the difference between the lowest threshold value of each word line and the lowest threshold limit to maintain the erased level will be equal to the program disturbance margin for a gate voltage applied thereto.

Figure 2:
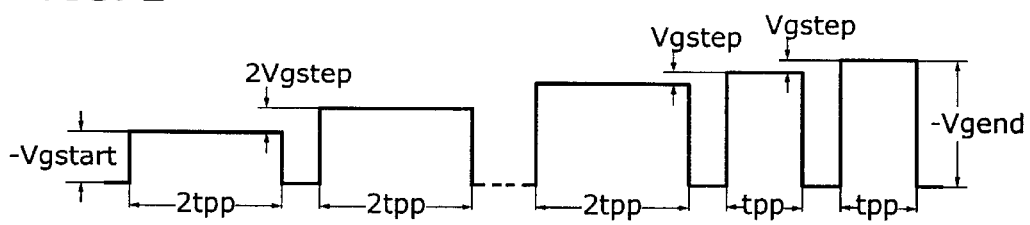
FIG. 2 is a schematic diagram showing a program disturbance pulse train.

FIG. 2 is a schematic diagram showing another program disturbance stress pulse train. So long as the program disturbance stress pulse train that is applied to the control gate 11 maintains a constant ratio of the voltage increase to the pulse width, the number of pulses required for the test can be reduced if both the pulse width and the voltage increase as shown in FIG. 2 are made larger in the first half period of the test. The disturbance stress pulse train in FIG. 2, has the pulse width of 2tpp and the voltage increase, in absolute figure, of 2Vgstep in the first half part of its pulse train. In the second half part thereof, the pulse width is set at tpp, and the voltage increase in absolute figure, is set constant at Vgstep. In this case, the ratio of the voltage increase to the pulse width, is 2Vgstep/2tpp in the first half, and Vgstep/tpp in the second half. These two ratios are identical. By maintaining these ratios identical and constant throughout the test, it is possible to obtain the identical amount of decrease in the threshold voltage as the one obtained by using the disturbance stress pulse train shown in FIG. 1.

If the voltage to be applied to each word line to complete programming all memory cells sharing the identical word line is known in advance, then the final voltage of the program disturbance stress pulse that will be applied to that particular word line can be set to that voltage.

If that particular voltage is not known in advance, then, it is also possible to separately measure the voltage to complete programming by the conventional method described in the test method 3 section, and use that voltage to set the final voltage of the program disturbance stress pulse. In this case, the shortcoming is that the overall test period will be prolonged by the time required for conducting an extra test for finding the final voltage to complete programming. To overcome this, a test method that shortens the testing time by providing a reference memory cell will be explained later in the third embodiment section.

The disturbance margin obtained through the steps described so far is then compared with the prescribed value to see if it is bigger or not. The memory cell array is judged good if the disturbance margin is bigger than the prescribed value. On the other hand, if it is not, the memory cell array is rejected.

Figure 4:
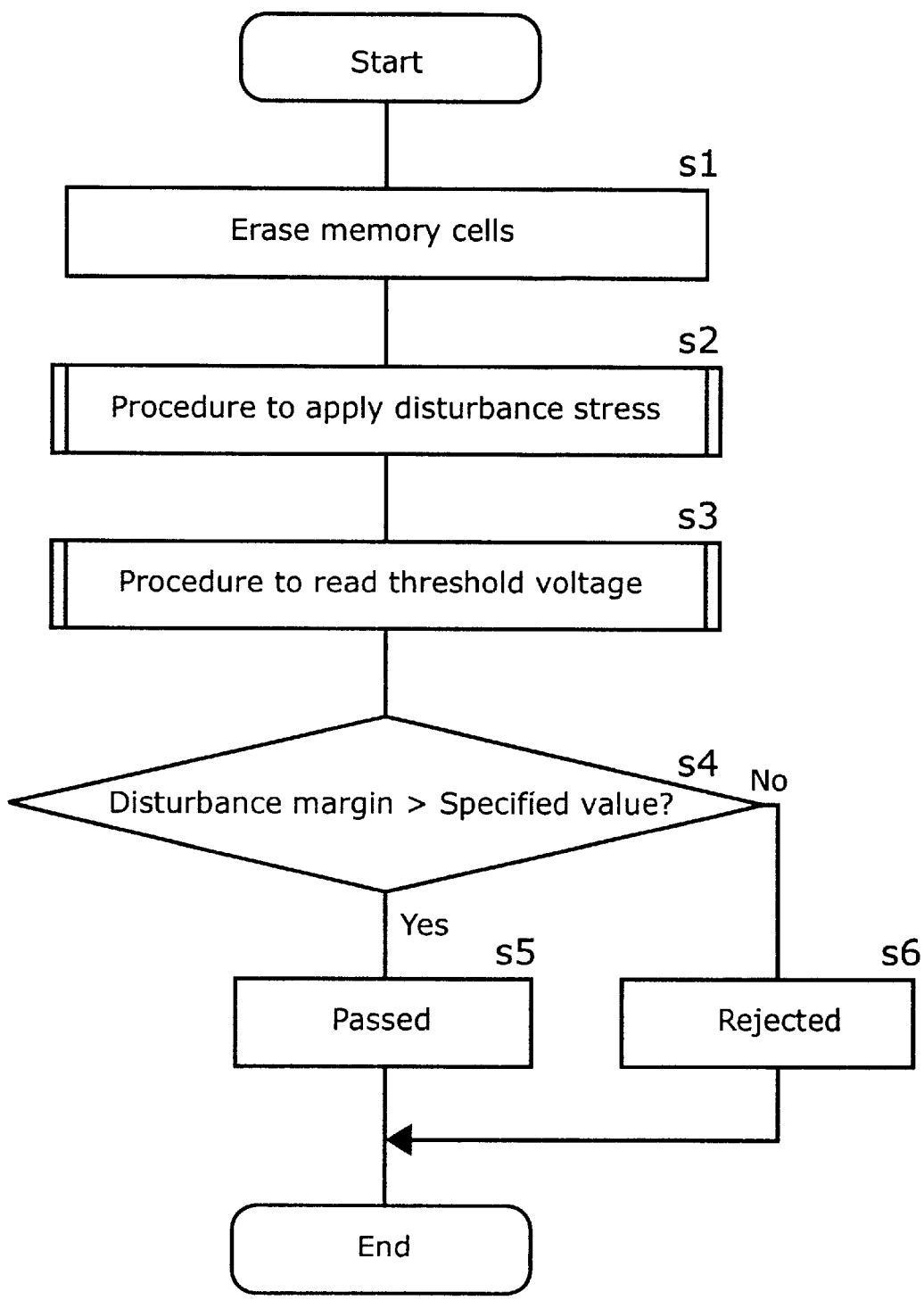
FIG. 4 is a flowchart explaining an algorithm of a program disturbance test.
Figure 5:
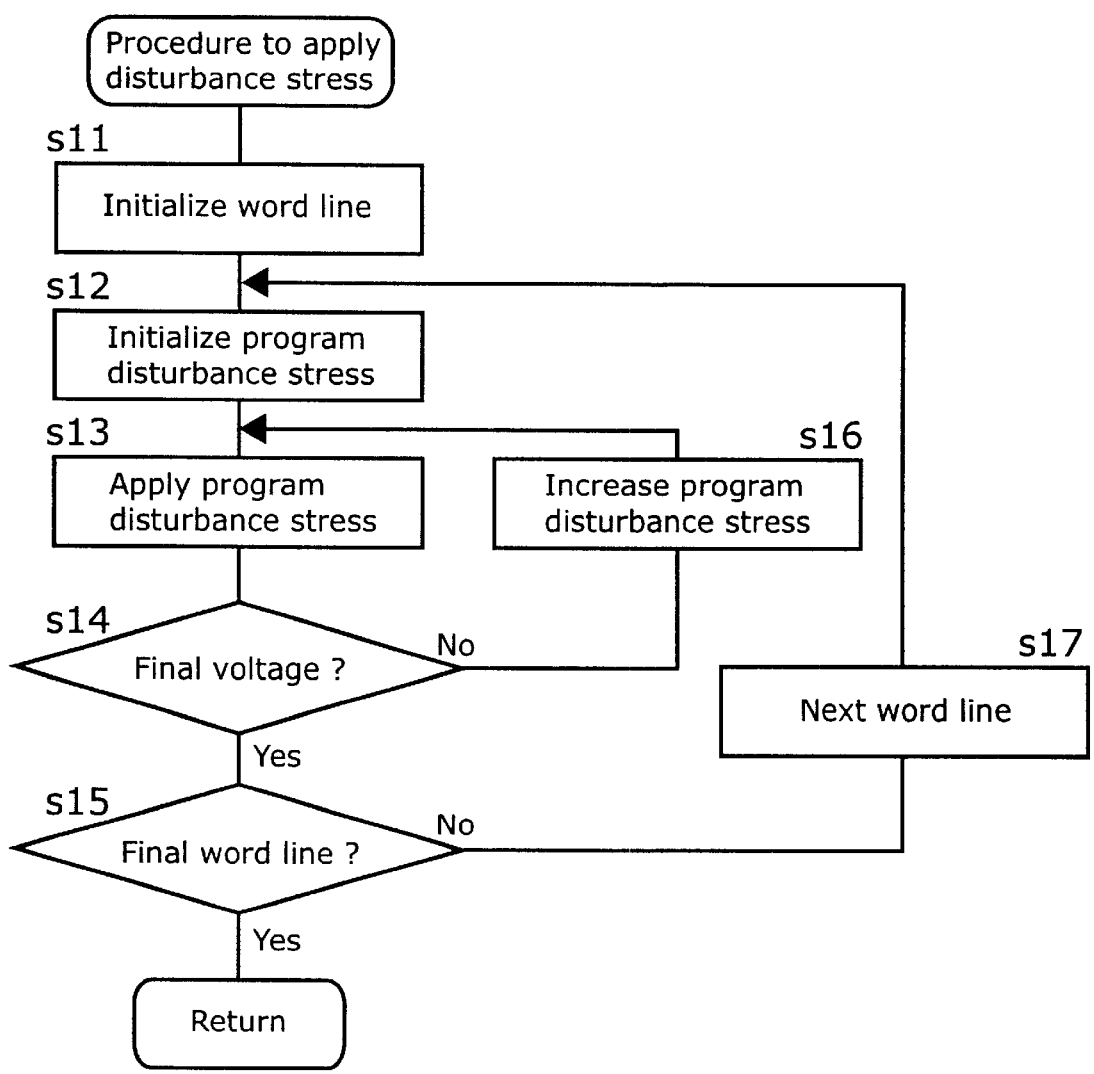
FIG. 5 is a flowchart explaining a disturbance stress application procedure.
Figure 6:
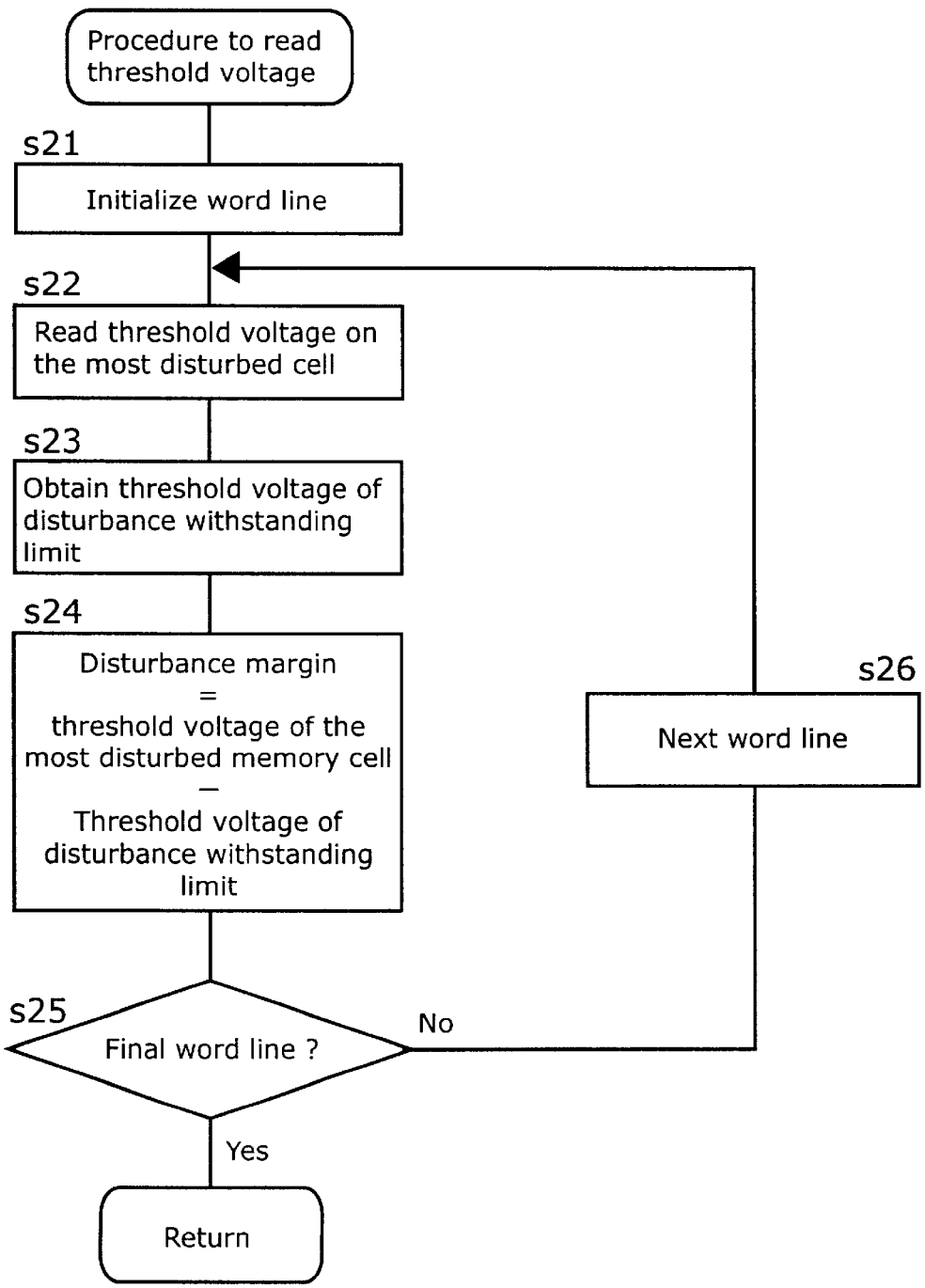
FIG. 6 is a flowchart explaining a procedure to read threshold values of memory cells.

Next, a procedure of the program disturbance test for examining semiconductor non-volatile memories relating to the first embodiment of the present invention will be described with reference to FIG. 4 to FIG. 6. FIG. 4 is a flowchart explaining an algorithm of a program disturbance test. FIG. 5 is a flowchart explaining a disturbance stress application procedure. FIG. 6 is a flowchart explaining a procedure to read threshold values of memory cells.

The algorithm of testing semiconductor non-volatile memories relating to the present invention, for example, can be adopted to test such a memory cell array 31 in FIG. 16. The test steps include erasing en bloc, the entire memory cells of the memory cell array 31 as shown in FIG. 4.

Then, a disturbance stress application procedure s2 is executed, followed by s11 in which a drain terminal 13f is left floating and a word line 32 is initialized as shown in FIG. 5. Next, as s12 shows, the program disturbance stress is initialized.

Here, the program disturbance pulse train, as shown in FIG. 1, has a constant pulse width at tpp and Vgstep increments in terms of absolute figure Furthermore, the final and the highest voltage for the disturbance stress pulse is set at a gate voltage of −Vgend, a necessary value to complete programming all the memory cells which share that particular word line.

Following s12, a program disturbance stress pulse is applied to the word line 32 as in s13. In s14, a comparison is made to see if this pulse voltage is the final voltage, −Vgend, or not. If it is not, as in s16, the pulse voltage will be increased by Vgstep in absolute figure as described before. Then s13 is repeated and a program disturbance pulse is applied again. In this way, s13, s14, and s15 are repeated until the program disturbance stress voltage reaches the final voltage.

While in s14, if the program disturbance stress pulse equals to the final pulse voltage, then the flow moves to s15 to check if the program disturbance stress pulse train has been applied to the final word line or not. If it is not, the flow moves to s17 and the next word line will be selected. Thereafter, the flow will repeat s12 to s15.

On the other hand, if the program disturbance stress pulse has been applied to the final word line, then as shown in FIG. 4, the flow moves to s3 and a threshold voltage read procedure will be executed. In other words, after applying the program disturbance stress pulses to all the word lines, the threshold value of the most disturbed memory cell among the memory cells sharing an identical word line, will be measured line by line.

Before doing so, first, the word line is initialized in s21 as shown in FIG. 6. Next, in s22, the threshold voltage of the most disturbed memory cell is measured. After the measurement, a lowest disturbance limit threshold voltage (a threshold of the most disturbed memory cell closest to the lowest threshold limit to maintain the erased level) will be calculated for each word line in s23.

In the case of the memory cell array 31 as shown in FIG. 16, the most disturbed memory cell among memory cells sharing the word line 32 is supposed to have the lowest threshold voltage. It is, therefore, possible to examine and evaluate the disturbance value of each word line by obtaining the lowest threshold voltage on each word line. Furthermore, the program disturbance margin is worked out by subtracting the lowest threshold value from the lowest disturbance limit threshold voltage on each word line.

In s25, a comparison is made to see if the disturbance margin has been obtained from the final word line or not. If not, as in s26, the next word line will be selected and the whole procedures from s22 to s25 will be repeated.

If the disturbance margin has been obtained from the final word line, then the tightest disturbance margin among the values obtained from each word line will be compared with the prescribed value as shown in s4. If it is bigger than the prescribed value, the memory cell array is judged good as described in s5. On the contrary, if it is not, the memory cell array is rejected as described in s6, and the whole procedure will end there.

Figure 3:
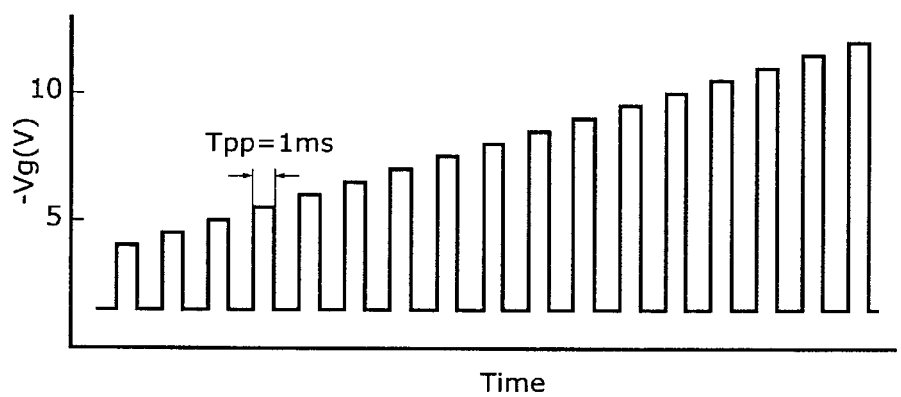
FIG. 3 is a schematic diagram showing a program disturbance pulse train.

The test method for semiconductor non-volatile memories relating to the first embodiment of the present invention will be described below in more details using specific values. FIG. 3 is a schematic diagram showing a program disturbance pulse train. As shown in this figure, this pulse train which will be applied to the control terminal of a memory cell is assumed to start from −4V, being increased in absolute figure, in 0. 5V increments, up to −12V. Simultaneously, the pulse width tpp is set at 1ms. It is to be understood that the values used in the following description are examples and do not suggest that application of the present invention is limited to particular test methods.

Figure 7:
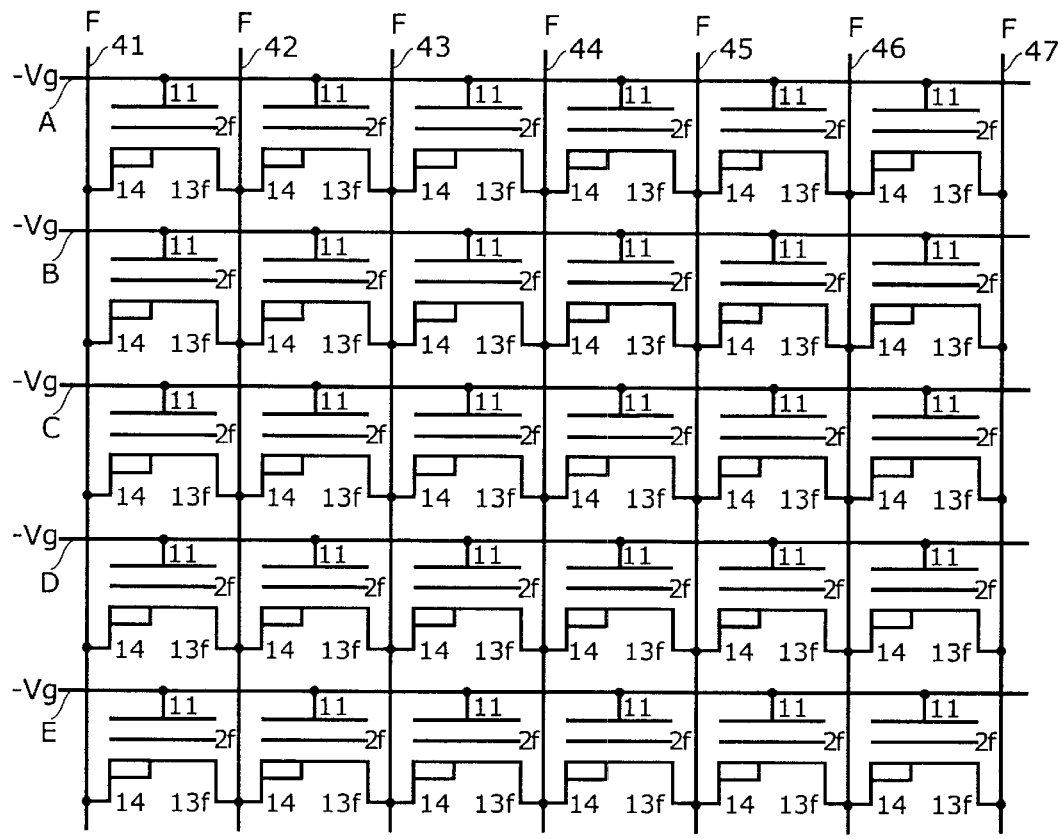
FIG. 7 is a schematic diagram showing a partial memory cell array of a semiconductor non-volatile memory having floating gates.

FIG. 7 is a schematic diagram showing a partial memory cell array of a semiconductor non-volatile memory having floating gates. The memory cell array shown in FIG. 7 has 30 memory cells, each of which has the control terminal II. Then, six memory cells as a group are connected through their individual control terminals 11 to each word line. This memory cell array, therefore, has five word lines from A to E. Five memory cells, through their individual drain terminals 13, are connected to the identical bit line which is then shared by five adjacent memory cells through source terminals 14 thereof. In this way, the memory cell array has seven bit lines, 41 to 47.

A single program operation is conducted on a single word line. Specifically, when −Vg is applied to a particular word line, this voltage is supplied to each control terminal of all memory cells sharing this word line. Thus, all of the memory cells connected to this word line will come under the influence of the same program operation simultaneously. In this way, program operations will progress word line by word line starting from a word line A, to B, C, and so forth.

During the program operation on each word line, such a pulse train as shown in FIG. 3 is applied. Simultaneously, the memory cell to be written to "1", takes +4V on its drain, while the drain of the memory cell to be written to "0" will be left floating. As seen in this operation, the memory cells to be written to "0" will be subjected to the word line voltage throughout the program operation. This will be the cause of the program disturbance stress.

The fastest disturbed memory cell is the one that is most susceptible to the disturbance stress among the memory cells sharing an identical word line. The slowest programmed memory cell is the one that takes the longest time to be programmed and written to "1" among the memory cells sharing the identical word line. In other words, the slowest programmed memory cell is the cell that requires the final pulse of the pulse train shown in FIG. 3 to be programmed.

Figure 8:
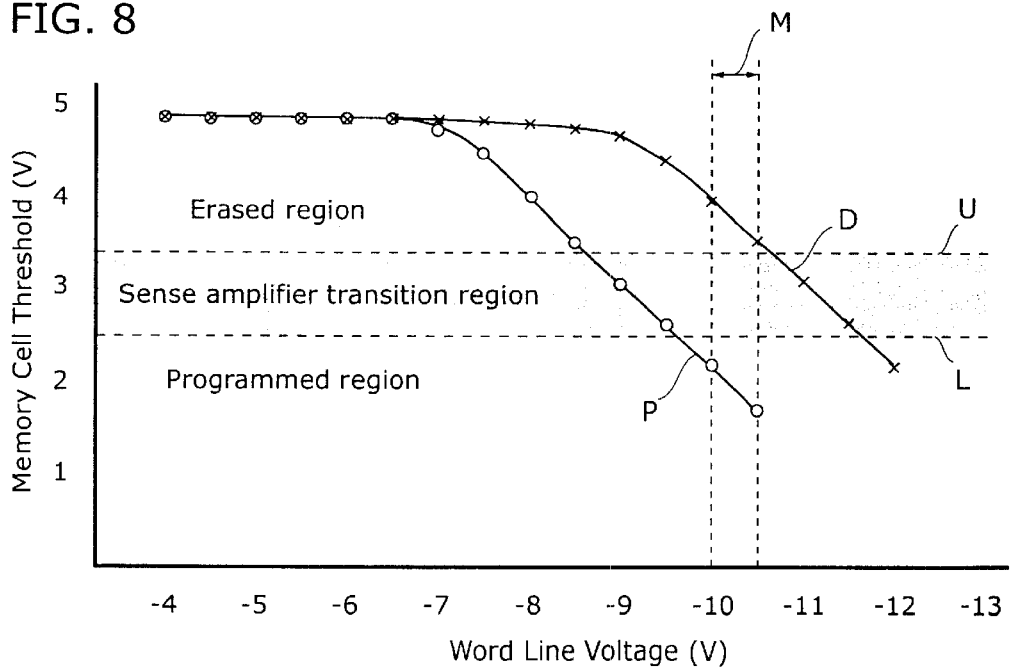
FIG. 8 is a chart showing a program characteristic and a program disturbance characteristic in conjunction with a relation between a word line voltage and a memory cell threshold voltage.

FIG. 8 is a chart showing a program characteristic P and a program disturbance characteristic D in conjunction with a relation between a word line voltage and a memory cell threshold voltage. As shown in FIG. 8, on each word line, there is a slowest programmed cell, for example, as shown by the curve P, and a fastest disturbed cell, for example, shown by the curve D. In conducting the program disturbance test, it is necessary to examine, word line by word line, which pulse step of the pulse train will be the final step to complete programming the memory cell showing the characteristic P, and whether a sufficient disturbance margin M is secured and if so, how sufficient it is when the disturbance stress as high as the above-mentioned final voltage is applied to, for example, the memory cell showing the characteristic D.

"Sense amplifier transition region" as shown in FIG. 8 is the region in which sensing results may not be correct due to variations in the circuit of a sense amplifier that is provided at the end of bit lines and reads the status of memory cells after comparing a prescribed reference voltage with a voltage converted from a current flowing in the memory cell. Considering this, an upper limit U of the sense amplifier transition region will be the limit for reading the erased status of the memory cell.

Figure 9:
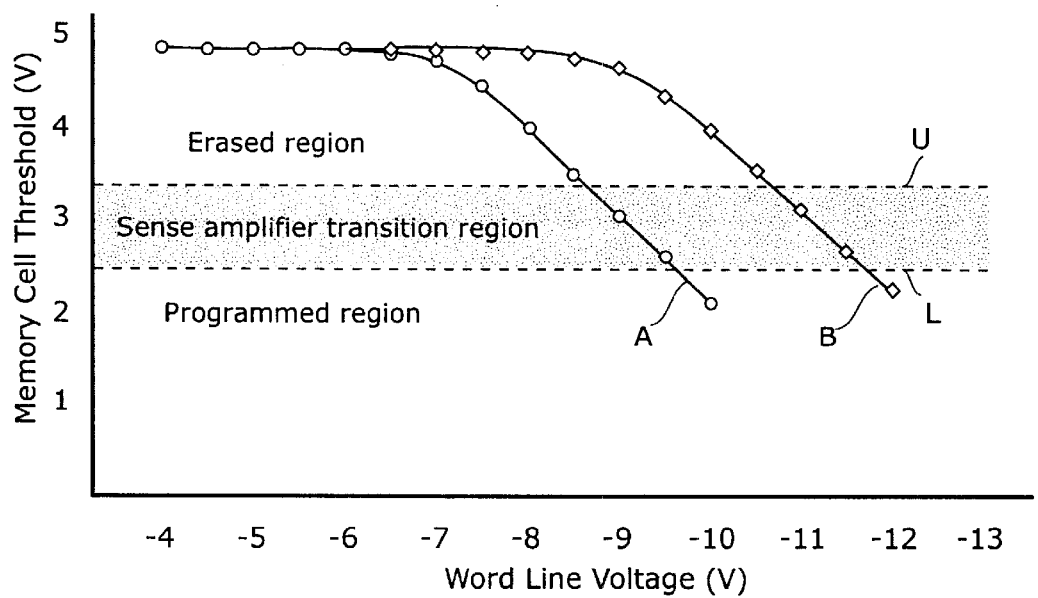
FIG. 9 is a chart explaining a program characteristic in conjunction with a relation between a word line voltage and a memory cell threshold voltage.
Figure 10A:
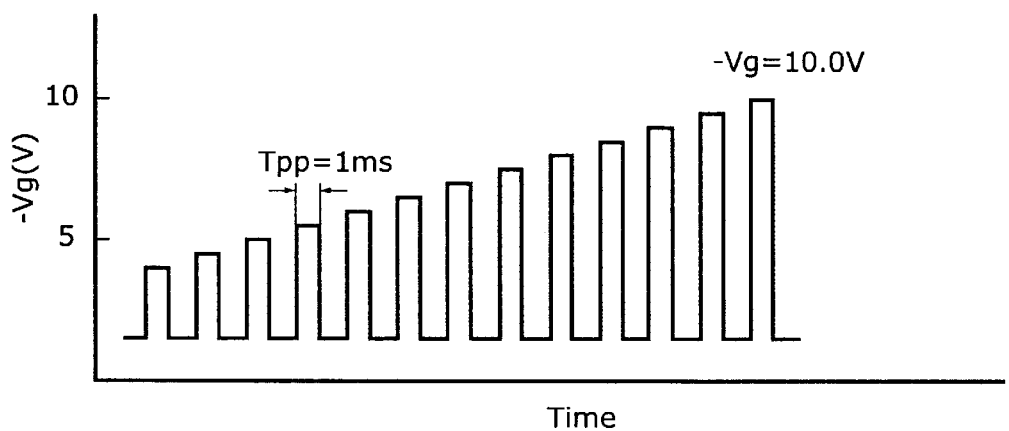
FIGS. 10A and 10B are schematic diagrams showing pulse trains being applied as disturbance stress.
Figure 10B:
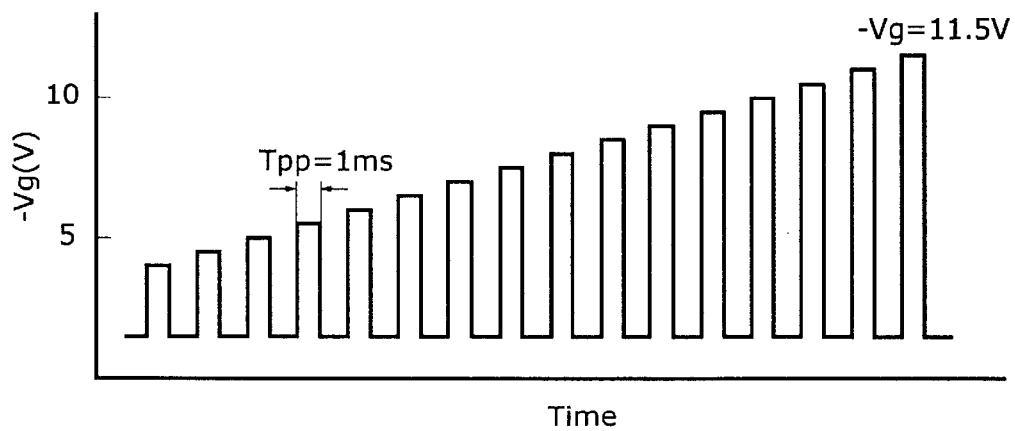

First, on every word line, a test is conducted by applying such a pulse train as shown in FIG. 3 to find the final step and the voltage that completes programming all memory cells sharing the identical word line. FIG. 9 is a chart explaining a program characteristic in conjunction with a relation between a word line voltage and a memory cell threshold voltage. FIGS. 10A and 10B are schematic diagrams showing pulse trains being applied as disturbance stress. For example as shown in FIG. 9, assume that the voltage to complete programming all of the memory cells on the word line A is −10V, and on the word line B is −11.5V.

In other words, the slowest programmed memory cell on the word line A is switched to the programmed region crossing the lower limit L of the sense amplifier transition region when a pulse of −10V is applied. Such a voltage as this should be obtained on every word line. These obtained values may be stored in a storage device provided within a testing apparatus or may be stored in a semiconductor non-volatile memory that will undergo the test.

Next, after erasing all the memory cells, a program disturbance stress voltage is applied in sequence to every word line. In this process, the stress being applied to the afore-mentioned word line A, for example, will be a pulse train having the final voltage of −10V as shown in FIG. 10A. To the afore-mentioned word line B, a pulse train having the final voltage of −11.5V as shown in FIG. 10B will be applied.

Figure 11:
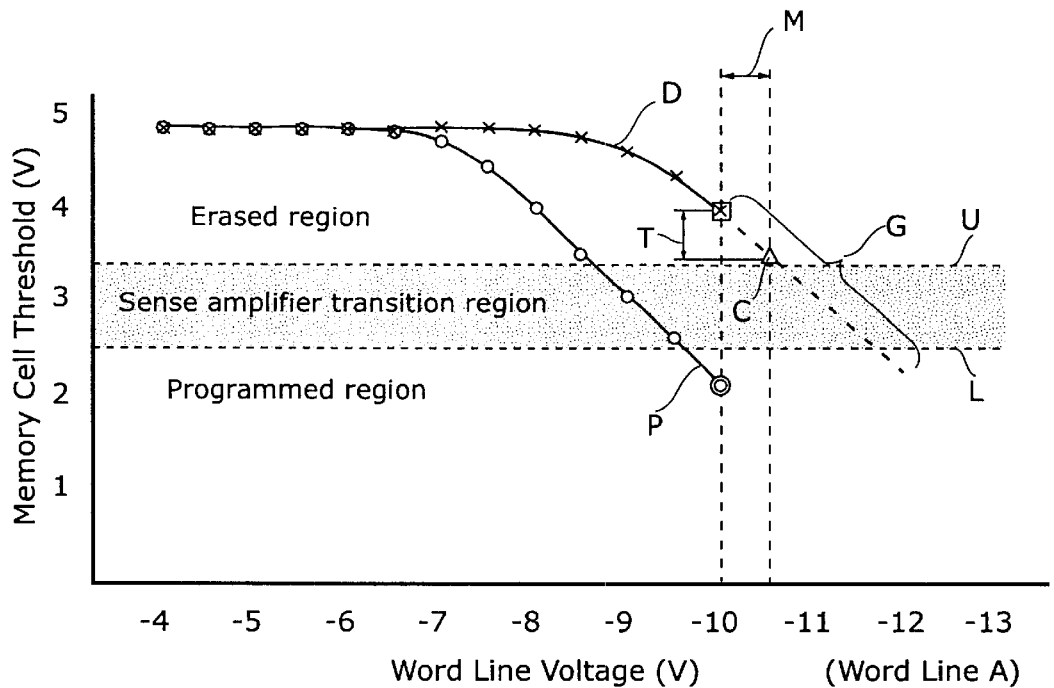
FIG. 11 is a chart showing a program characteristic and a program disturbance characteristic in conjunction with a relation between a word line voltage and a memory cell threshold voltage.

On completion of applying the disturbance stress pulse train to all of the word lines, the lowest threshold value is obtained from each word line since the most disturbed memory cell has the lowest threshold value. An example using word line A with reference to FIG. 11 is explained below. FIG. 11 is a chart showing a program characteristic P and a program disturbance characteristic D in conjunction with a relation between a word line voltage and a memory cell threshold voltage.

Changes in the threshold value of the slowest programmed (written to "1") memory cell that is programmed by a word line voltage of −10V has been measured in advance, are shown by circle marks. A double-circle mark shows a point where the memory cell has been programmed. Changes in the threshold voltages when a pulse train up to −10V is applied to the fastest disturbed memory cell through this particular word line, are shown by "x" marks. A square mark shows the point where the final voltage is applied. A line G declining in the linear curve of 1 from the square mark will cross the upper limit U of the sense amplifier transition region. The threshold value closest to the crossing point is shown by C.T. shows a difference between the threshold value at C and the threshold value of the fastest disturbed memory cell when the final word line voltage of −10V is applied. This value T, then, will be obtained on each word line.

As described before, an increase in the gate voltage is equivalent to the change in should value. That is, | threshold variation |=| word line voltage variation |. Thus, the difference T is equivalent to a program disturbance margin.

Second Embodiment

In the first embodiment of the present invention, a description was made on a test of applying, word line by word line, a program disturbance stress up to the final step age by which all of the memory cells sharing the identical word line are programmed. embodiment, another test method of applying, word line by word line, a program disturbance stress up to a specified step before the final step in which all of the memory cells sharing an identical word line are programmed, will be described.

Figure 12:
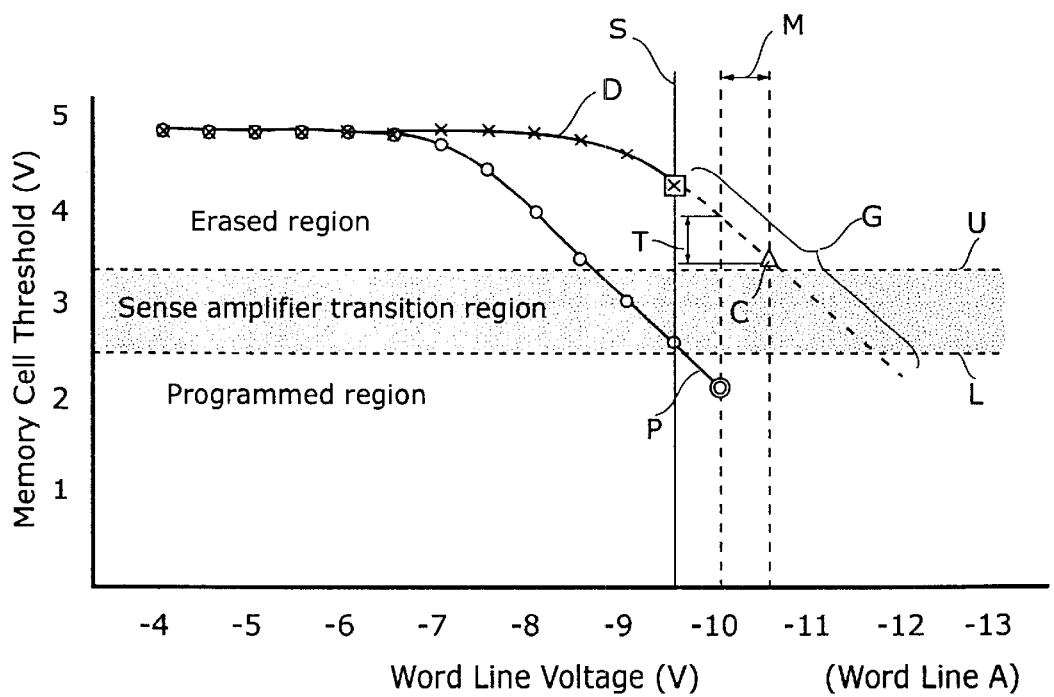
FIG. 12 is a chart showing a program characteristic and a program disturbance characteristic in conjunction with a relation between a word line voltage and a memory cell threshold voltage.

FIG. 12 is a chart showing a program characteristic P and a program disturbance characteristic D in conjunction with a relation between a word line voltage and a memory cell threshold voltage. For example, as shown in FIG. 12, a program disturbance stress is applied to the word line A and increased up to a point S (−9.5V), one step before the final step (−10V) in which all of the memory cells sharing the identical word line complete programming. This method can save one step on every word line when applying the disturbance stress pulse train. Because of this benefit, the time required for the test will be shortened.

First, after erasing all of the memory cells, a program disturbance stress pulse is applied in sequence to every word line. This is an identical procedure as mentioned in the first embodiment, except that the final voltage is different. Although it is not illustrated, the pulse train being applied to the afore-mentioned word line A, for example, will be a pulse train having the final voltage of −9.5V. To the afore-mentioned word line B, a pulse train having the final voltage of −11.5V will be applied. Thereafter, a procedure of measuring the lowest threshold value of the memory cells on each world line will be executed. This procedure is again identical as mentioned before.

In this method, the characteristic of memory cells connected to the word line A will be described with reference to FIG. 12. Assume that the word line voltage to program (written to "1") the slowest memory cell is −10V. Then, the threshold voltage of the fastest disturbed memory cell will be measured (at square mark) when a stepped pulse voltage of up to −9.5V, one step before the above-mentioned word line voltage, is applied. Line G declining in the linear curve of 1 from the square mark will cross the upper limit U of the sense amplifier transition region. The word line voltage closest to this crossing point is shown by C. Then, the program disturbance margin M on the word line A will be equivalent to the difference between the word line voltage at C and the above-mentioned word line voltage of −10V.

The theory used with reference to FIG. 11 can be applicable here again. The tightest program disturbance margin among the ones obtained on each word line based on the method mentioned with reference to FIG. 11, will be the program disturbance margin of this memory cell array.

In this embodiment of the present invention, the test method of applying a series of pulse voltages until one step before the voltage which completes programming all of the memory cells sharing an identical word line, has been explained. Another method of applying the voltage, for example, up to two or three steps before is also possible. The test method is identical with the one described with reference to FIG. 12. Using this method, the time required for completing the test will be further shortened.

The methods described in the first and the second embodiments are effective for testing for the accurate disturbance value and the disturbance margin on each word line.

Third Embodiment

In this embodiment, another test method that can further shorten the testing time substantially, although an accuracy may be slightly sacrificed, will be described. First, a test for finding the final voltage of the pulse train as shown in FIG. 3 to complete programming all of the memory cells sharing the identical word line, is entirely eliminated if the final voltage for programming is prescribed by specifications or the like.

Another test method uses a reference memory cell for simultaneously conducting two tests, a test for finding the final voltage on every word line to complete programming and another test of applying the program disturbance stress.

Figure 13:
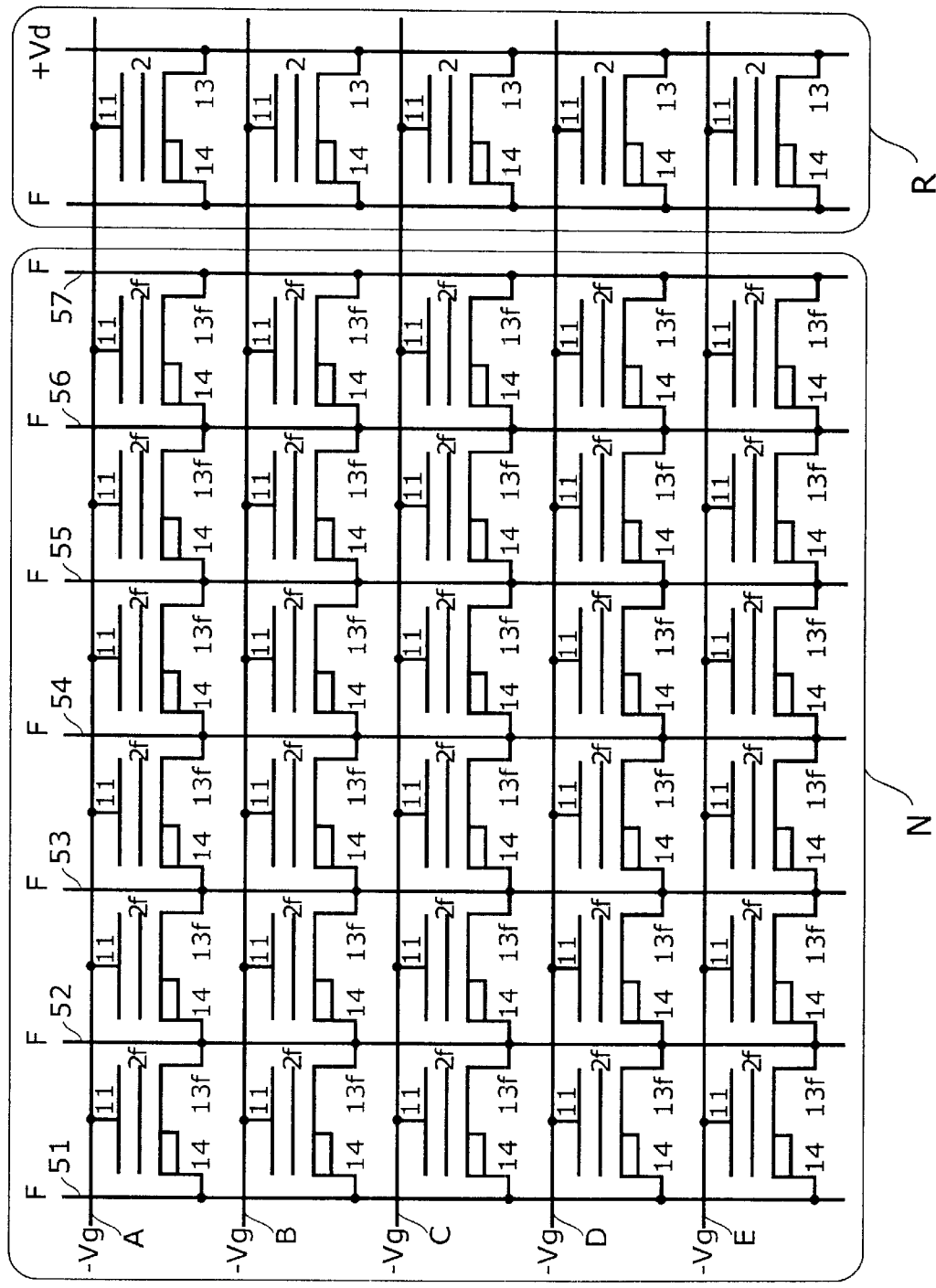
FIG. 13 is a schematic diagram showing a memory cell array of a semiconductor non-volatile memory.

FIG. 13 is a schematic diagram showing a memory cell array of a semiconductor non-volatile memory. As shown in FIG. 13. each memory cell outside a main memory cell array N sharing an identical word line is used as a reference memory cell R. A voltage is applied to the drain of each reference memory cell, word line by word line. On the other hand, all the drains of the main memory cell array N are left floating. Then, a program disturbance stress pulse train such as the one shown in FIG. 3 will be applied to each word line.

Here, the threshold values of the reference memory cell decreases and the memory cell in the main memory cell array N are subjected to the program disturbance stress through each word line. At a certain word line voltage, the reference memory cell is programmed written to "1"). The programming test and the program disturbance test are conducted simultaneously by keeping applying the word line voltage up to the above-mentioned programming point or up to a specified step beyond the programming point. In doing so, the word line voltage can cover at least the final voltage which completes programming the reference memory cell.

Figure 14:
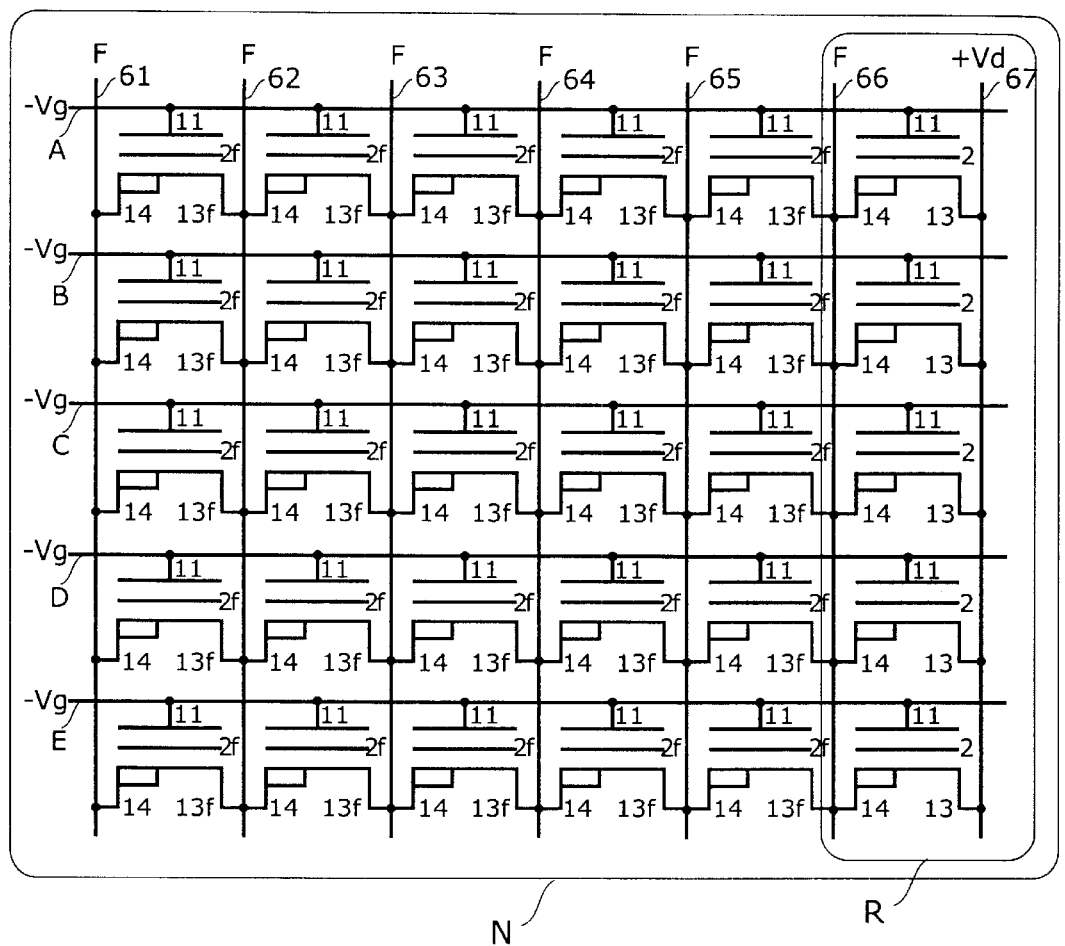
FIG. 14 is a schematic diagram showing a partial memory cell array of a semiconductor non-volatile memory having floating gates.

FIG. 14 is a schematic diagram showing a partial memory cell array of a semiconductor non-volatile memory having floating gates. If any given memory cell in the main memory cell array N is provided and used as the reference memory cell R, then it is without increasing a memory chip size, to conduct an equivalent test for the disturbance value and the program disturbance margin as described with reference to FIG. 13

It is to be understood that the values used in the above description are examples and do not suggest that application of the present invention is limited to particular test methods.

What is claimed is:

1. A method of testing a semiconductor non-volatile memory including a plurality of memory cells each having a gate, a floating gate, a drain, and a source, comprising:

after erasing the memory cells, maintaining the drain and the source of each memory cell floating and applying a program disturbance stress pulse train whose voltage changes in increments, to a word line to which the memory cells are connected, until the voltage reaches a final voltage of the program disturbance stress pulse train;

repeating the maintaining and applying by changing word lines until a final word line is completed; and obtaining from each word line a disturbance margin that is caused by the program disturbance stress applied to the memory cell by measuring a lowest threshold value among the memory cells sharing an identical word line by changing word lines until the final word line is completed.

2. A method of testing a semiconductor non-volatile memory as claimed in claim 1, wherein said program disturbance stress pulse train has a series of incremental pulses in which a ratio of a voltage increase to a pulse width is always constant, and the pulse width and the voltage increase are fixed in a first half and a second half of the program disturbance stress pulse train, or the pulse width and the voltage increase in the first half are larger than in the second half of the program disturbance stress pulse train.

3. A method of testing a semiconductor non-volatile memory as claimed in claim 2, wherein said final voltage is a voltage required to complete programming all of the memory cells that are connected to an identical word line and are subjected to an identical program disturbance stress simultaneously.

4. A method of testing a semiconductor non-volatile memory including a plurality of memory cells each having a gate, a floating gate, a drain, and a source, comprising:

a first step of applying, after erasing the memory cells, a program disturbance stress pulse train whose voltage changes in increments, to a word line to which the memory cells are connected, until the voltage reaches a final voltage of the program disturbance stress pulse train;

a second step of repeating the first step by changing word lines until a final word line is completed; and a third step of measuring a lowest threshold value among the memory cells sharing an identical word line by changing word lines until the final word line is completed, wherein said program disturbance stress pulse train has a series of incremental pulses in which a ratio of a voltage increase to a pulse width is always constant, the pulse width and the voltage increase are fixed in a first half and a second half of the program disturbance stress pulse train, or the pulse width and the voltage increase in the first half are larger than in the second half of the program disturbance stress pulse train, said semiconductor non-volatile memory has a reference memory cell within a region of a plurality of memory cells that are subjected to an identical program disturbance stress simultaneously, when applying said program disturbance pulse train, a program pulse train is also applied to a drain terminal of said reference memory cell, and the program disturbance stress train is kept being applied until the step when the reference memory cell has been programmed or until a step beyond the step when the reference memory cell has been programmed.

5. A method of testing a semiconductor non-volatile memory as claimed in claim 4, wherein said reference memory cell is provided outside a region of a plurality of memory cells that are subjected to an identical program disturbance stress simultaneously.

6. A method of testing a semiconductor non-volatile memory as claimed in claim 2, wherein said final voltage may be any given voltage before a step required to complete programming all of the memory cells that are connected to an identical word line and are subjected to an identical program disturbance stress simultaneously.

7. A method of testing a semiconductor non-volatile memory including a plurality of memory cells each having a gate, a floating gate, a drain and a source, comprising:

measuring each word line for a final voltage required to complete programming all of a plurality of memory cells that are connected to an identical word line;

erasing all the memory cells;

maintaining the drain and the source of each memory cell floating and applying a program disturbance stress pulse train having a series of incremental pulses in which a ratio of a voltage increase to a pulse width is constant, to the word line to which the memory cells are connected, until the voltage reaches the final voltage;

repeating the maintaining and applying by changing word lines until a final word line is completed;

measuring a lowest threshold value among the memory cells sharing the identical word line by changing word lines until the final word line is completed; and obtaining a disturbance margin for each word line from the lowest threshold value that is measured on each word line, wherein the word line connected to an abnormal memory cell is identified by the disturbance margin obtained for each word line.

* * * * *

UNITED STATES PATENT AND TRADEMARK OFFICE
CERTIFICATE OF CORRECTION

PATENT NO. : 6,490,198 B2
DATED : December 3, 2002
INVENTOR(S) : Yoshimura et al.

It is certified that error appears in the above-identified patent and that said Letters Patent is hereby corrected as shown below:

<u>Column 6,</u>
Line 52, reads "or", should be -- of --.

Signed and Sealed this

Eighteenth Day of March, 2003

JAMES E. ROGAN
*Director of the United States Patent and Trademark Office*